United States Patent
Kobayashi et al.

(10) Patent No.: US 7,545,015 B2
(45) Date of Patent: Jun. 9, 2009

(54) PHOTO-DETECTION DEVICE AND MANUFACTURING METHOD THEREOF

(75) Inventors: Hiroya Kobayashi, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 432 days.

(21) Appl. No.: 10/530,756

(22) PCT Filed: Oct. 8, 2003

(86) PCT No.: PCT/JP03/12912

§ 371 (c)(1), (2), (4) Date: Nov. 10, 2005

(87) PCT Pub. No.: WO2004/034004

PCT Pub. Date: Apr. 22, 2004

(65) Prior Publication Data

US 2006/0151796 A1 Jul. 13, 2006

(30) Foreign Application Priority Data

Oct. 10, 2002 (JP) .............................. 2002-297607

(51) Int. Cl.
*H01L 27/148* (2006.01)
*H01L 21/00* (2006.01)

(52) U.S. Cl. ........................................ 257/447; 438/57

(58) Field of Classification Search .................... 438/22, 438/26, 48, 57, 58, 60, 69, 75, 116; 257/E27.133, 257/E27.136, E27.151, E27.156, E31.131, 257/E27.159, 10, 11, 21, 53–56, 72, 113–118, 257/184–189, 225–234, 257, 258, 290–294, 257/414, 431–466, 106, 79–103, 918, 64
See application file for complete search history.

(56) References Cited

U.S. PATENT DOCUMENTS

| | | | |
|---|---|---|---|
| 4,039,114 A | * | 8/1977 | Yoshida et al. ................ 228/1.1 |
| 5,508,740 A | * | 4/1996 | Miyaguchi et al. .......... 348/244 |
| 6,204,556 B1 | | 3/2001 | Hakamata |
| 2001/0025915 A1 | | 10/2001 | Akahori et al. |

(Continued)

FOREIGN PATENT DOCUMENTS

JP  04-290464  10/1992

(Continued)

*Primary Examiner*—Ha Tran T Nguyen
*Assistant Examiner*—Karen M Kusumakar
(74) *Attorney, Agent, or Firm*—Drinker Biddle & Reath LLP

(57) ABSTRACT

A photodetection device is provided that includes a semiconductor substrate having a back surface which serves as a light-incident surface, and a front surface which opposes the back surface and is provided with a CCD reading part that detects light propagating from the back surface; a cooling device cooling the CCD reading part; and a package having a cavity that houses the semiconductor substrate and cooling device. The semiconductor substrate is fixed to a cavity bottom part of the package via the cooling device, and at the back surface thereof, a portion corresponding to a region at which the CCD reading part is disposed, is made thin. The cooling device has a cooling surface contacting the front surface of the semiconductor substrate while covering the region at which the CCD reading part is disposed.

9 Claims, 6 Drawing Sheets

U.S. PATENT DOCUMENTS

2002/0020859 A1 2/2002 Muramatsu
2003/0034436 A1 2/2003 Muramatsu et al.

FOREIGN PATENT DOCUMENTS

| JP | 05-047972 | 2/1993 |
| JP | 06-120381 | 7/1994 |
| JP | 09-082852 | 3/1997 |
| JP | 11-251566 | 9/1999 |
| JP | 2000-138365 | 5/2000 |
| JP | 2001-298104 | 10/2001 |
| JP | 2002-033467 | 1/2002 |
| WO | WO 00/62344 | 10/2000 |

* cited by examiner

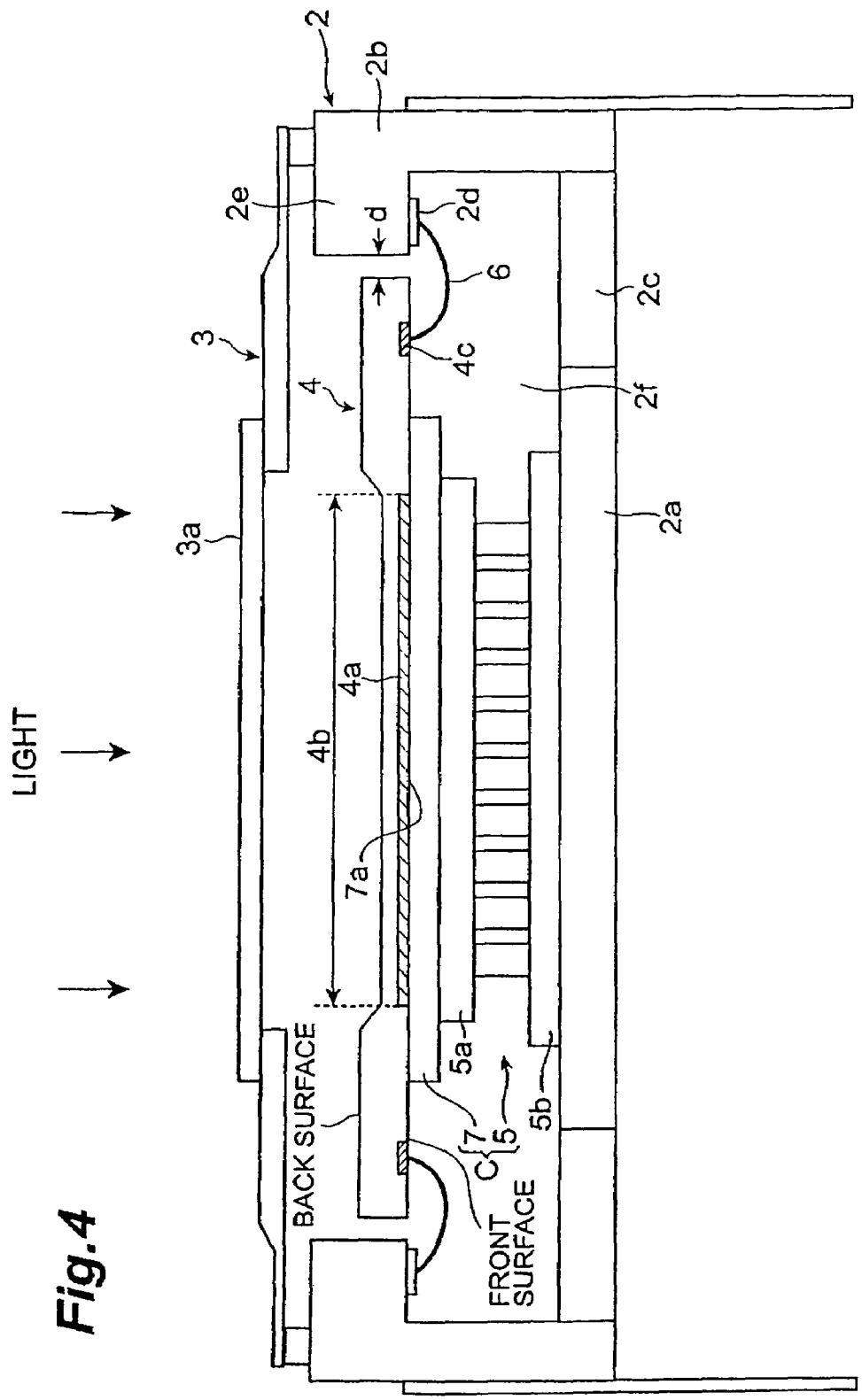

PHOTO-DETECTION DEVICE AND MANUFACTURING METHOD THEREOF

TECHNICAL FIELD

This invention relates to a photodetection device, in particular, a back-illuminated type photodetection device, with which light that has been made incident from a back surface is detected using a photoelectric conversion element disposed on a front surface that opposes the back surface, and a method of manufacturing such a photodetection device.

BACKGROUND ART

A photodetection device (referred to hereinafter as "back-illuminated type photodetection device"), with which light that has been made incident on a back surface and has been transmitted through a semiconductor substrate is detected by a charge reading part (referred to hereinafter as "charge-coupled device (CCD) reading part"), comprising a charge-coupled device disposed on a front surface of the semiconductor substrate, has good sensitivity down to shorter wavelengths in comparison to a photodetection device (referred to hereinafter as "front-illuminated type photodetection device"), with which incident light is detected directly by a CCD reading part disposed on a front surface. A back-illuminated type photodetector is thus suited as a photodetector for a spectroscopic analysis device that is required to enable measurements of a wide wavelength range. With a photodetector in this field of spectroscopic analysis, high resolution imaging characteristics and high signal-to-noise ratio (S/N) characteristics are strongly demanded.

In order to achieve high S/N characteristics in the above-described back surface incidence type photodetection device, the CCD reading part must be cooled actively using a Peltier element, etc. A back-illuminated type photodetection device equipped with such a cooling structure is described, for example, in Japanese Patent Application Laid-Open No. 4-290464. As shown in FIG. 1, a conventional back-illuminated type photodetection device is equipped with a semiconductor substrate 101, on one surface of which is formed a CCD reading part 102, a package 103, holding this semiconductor substrate 101, and a cover 104, closing off package 103 at the side of semiconductor substrate 101 on which the CCD reading part is formed. A heat conducting member 108, which exhibits plasticity at least at room temperature, is sealed between CCD reading part 102 and cover 104, and a cooling member 107 is disposed at the exterior of package 103 in a manner such that a cooling surface of cooling member 107 contacts cover 104.

DISCLOSURE OF THE INVENTION

The present inventors have found the following issue as a result of studying the prior art described above. That is, the back-illuminated type photodetection device described in Japanese Patent Application Laid-Open No. 4-290464 is excellent in regard to the point that heat conductive member 108 is sealed between CCD reading part 102 and cover 104, thereby promoting the heat conduction of cooling member 107 and CCD reading part 102 in order to cool CCD reading part 102, which generates heat.

However, with a structure with which CCD reading part 102 is cooled via package 103, the entirety of package 103 must be cooled as well in order to cool CCD reading part 102 adequately. The conventional back-illuminated type photodetection device was thus poor in cooling efficiency and had an issue in that a cooling member 107 of high cooling capacity (and thus of large size) had to be used. The conventional back-illuminated type photodetection device also had the issue of becoming large in size due to cooling member 107 being mounted externally to package 103.

The present invention has been made to resolve the above issues and an object thereof is to provide a photodetection device, having a structure that enables efficient cooling of a CCD reading part and the making of the entire device compact, and a method of manufacturing such a photodetection device.

The photodetection device according to the present invention is directed to a back-illuminated type photodetection device, with which light that has been made incident on a back surface is detected by a photodetection part disposed on a front surface. Specifically, this photodetection device comprises: a semiconductor substrate, having a back surface, serving as a light-incident surface, and a front surface, opposing the back surface and being provided with a charge reading part (CCD reading part), in turn comprising a charge-coupled device that detects light propagating from the above-mentioned back surface; a cooling device, cooling the above-mentioned CCD reading part; a package, housing the semiconductor substrate and cooling device; and electrode pads, package terminals, and bonding wires, making up a part of electrical wiring.

In the back surface of the semiconductor substrate, a recess is formed in a region corresponding to the region on the front surface at which the CCD reading part is disposed. The semiconductor substrate thus has a structure wherein the thickness of the region at which the CCD reading part is disposed is thinner than the thickness of the remaining regions. Also, on the front surface of the semiconductor substrate, electrode pads are disposed at the peripheral of the region at which the CCD reading part is disposed. The cooling device has a cooling surface, which, in a state of covering the entirety of the CCD reading part, contacts the front surface of the semiconductor substrate. This cooling surface that cools the entirety of the CCD reading part has a size that is larger than the region at which the CCD reading part is disposed and yet smaller than the entirety of the front surface of the semiconductor substrate. The package has a cavity, housing both the semiconductor substrate and the cooling device, and package terminals, for electrical communication between the cavity and the exterior of the package. The electrode pads, disposed on the front surface of the semiconductor substrate, and the package terminals are electrically connected by bonding wires.

Since the semiconductor substrate and the cooling device are housed within a single package as mentioned above, this photodetection device can be made compact. Also, since the cooling surface of the cooling device contacts the front surface of the semiconductor substrate, on which the CCD reading part is provided, so as to cover the region at which the CCD reading part is formed, the CCD reading part can be cooled directly using the cooling device.

Also, since electrode pads are disposed at the peripheral of the region, of the front surface of the semiconductor substrate, at which the CCD reading part is disposed and these electrode pads and the package terminals are electrically connected by bonding wires, the wiring for taking out the charge signals of the CCD reading part to the exterior of the package can be made short in length, and the high-speed response of the photodetection device can thereby be maintained at a high level.

The cooling surface of the cooling device, which is put in contact with the front surface of the semiconductor substrate in the state of covering the region at which the CCD reading part is disposed, has a larger size than the portion of the semiconductor substrate that has been made thin (the region at which the CCD reading part is disposed). Thus, by putting the cooling surface in contact with the front surface of the semiconductor substrate, the thinned portion (which is poor in mechanical strength) is fortified mechanically.

The cooling device is fixed to the package in a state in which the surface at the side opposite the cooling surface contacts a bottom part of the cavity. Working openings are preferably formed at positions of this cavity bottom part that correspond to the electrode pads and package terminals. Since the work of connecting the electrode pads and the package terminals with bonding wires can be performed from the working openings, such wire bonding work can be performed readily. These working openings are preferably closed by covers after the wire bonding work (airtight sealing of the cavity).

Furthermore, the package preferably has a top plate for closing an upper opening of the cavity, and the semiconductor substrate and the cooling device are housed in the space in the cavity that is defined by this top plate. Such an arrangement effectively prevents the movement of gases between the upper opening and the exterior. Thus, in the case where the interior of the cavity is filled with an inert gas atmosphere or is made a vacuum, dew condensation on the semiconductor substrate and the cooling device can be prevented effectively. Also, by the provision of the top plate, the semiconductor substrate is protected from contamination and mechanical impacts.

In the photodetection device according to the present invention, the semiconductor substrate is preferably separated by a predetermined distance from the inner walls of the cavity of the package and the semiconductor substrate is preferably supported by the package via the cooling device. With such an arrangement, the semiconductor substrate does not contact the package with the exception of the bonding wires and the cooling surface of the cooling device. The conduction of heat from the package to the CCD reading part, disposed on the front surface side of the semiconductor substrate, can thus be restrained to the minimum.

Specifically, the cooling device preferably includes a Peltier element and a cooling plate, contacting the cooling side of the Peltier element. The surface of the cooling plate, at the opposite side of the surface that contacts the cooling side of the Peltier element, is put in contact, as the cooling surface, with the semiconductor substrate. Normally, by varying the amount of current that is passed through the Peltier element, the cooling side of the Peltier element can be cooled to a desired temperature. Since only the cooling plate is thus interposed between the cooling side of the Peltier element and the front surface of the semiconductor substrate on which the CCD reading part is disposed, the heat conducting efficiency between the cooling side of the Peltier element and the CCD reading part can be maintained satisfactorily and the CCD reading part can be cooled efficiently.

In a photodetection device manufacturing method according to the present invention, the semiconductor substrate, cooling device, and package, with the above-described structures, are prepared.

The semiconductor substrate has a back surface, serving as a light-incident surface, and a front surface, opposing the back surface and having disposed thereon a CCD reading part, which detects light propagating from the back surface. Also with this semiconductor substrate, a recess is formed in a predetermined region of the back surface that corresponds to the region on the front surface at which the CCD reading part is disposed, and the semiconductor substrate is thereby provided with a structure, wherein the thickness of the region at which the CCD reading part is disposed is thinner than the remaining regions. Furthermore, on the front surface of the semiconductor substrate, electrode pads are disposed at peripheral parts of the region at which the CCD reading part is disposed. The cooling device has a cooling surface, which, in the state of covering the entirety of the CCD reading part, contacts the front surface of the semiconductor substrate. This cooling surface that cools the entirety of the CCD reading part has a size that is larger than the region in which the CCD reading part is disposed and yet smaller than the entirety of the front surface of the semiconductor substrate. The package has a cavity, housing both the semiconductor substrate and the cooling device, and package terminals, for electrical communication between the cavity and the exterior.

In accordance with the photodetection device manufacturing method according to the present invention, first, the cooling device is set inside the cavity so that the surface of the cooling device at the side opposite the cooling surface faces the bottom part of the cavity. The front surface of the semiconductor substrate is then put in contact with the cooling surface so that the semiconductor substrate does not contact the inner walls of the cavity and yet the CCD reading part is covered by the cooling surface. Thereafter, the electrode pads, disposed at the peripheral parts of the region of the front surface of the semiconductor substrate that is covered by the cooling surface, and the package terminals, disposed on the package, are electrically connected by bonding wires.

As described above, by the photodetection device manufacturing method according to the present invention, since the semiconductor substrate and the cooling device are housed in a single package, the photodetection device itself can be made compact. Also, since the front surface of the semiconductor substrate, on which the CCD reading part is disposed, is put in contact with the cooling surface of the cooing device, the heat conducting efficiency between the cooling surface and the CCD reading part is maintained at a satisfactory level (the CCD reading part is cooled efficiently).

Also, since the semiconductor substrate is housed in the cavity in a state of being separated from the cavity inner walls by a predetermined distance, the package and the semiconductor substrate do not contact each other directly with the exception of the bonding wires and the cooling device. Heat conduction from the package to the semiconductor substrate is thus restrained and the CCD reading part can be cooled efficiently.

The connections of the electrode pads and the package terminals by the bonding wires are preferably made in a state in which the semiconductor substrate is supported by a jig that has been inserted from the upper opening of the cavity. By the wire bonding work being carried out in the state in which the semiconductor substrate is thus supported by a jig, breakage of the semiconductor substrate due to impact, etc., can be avoided. In addition, working openings are preferably provided at positions of the bottom part of the cavity of the package that correspond to the electrode pads and the package terminals. By the connections of the electrode pads and the package terminals by the bonding wires being made through these working openings, the wire bonding work is facilitated. Also, the wiring for taking out the charge signals of the CCD reading part can be made short in length.

After the wire bonding work, the working openings are preferably closed with covers. Likewise, preferably after the wire bonding work, the upper opening of the cavity is closed by a top plate. By thus closing the upper opening of the cavity by a top plate, the interior of the cavity can be readily filled with an inert gas atmosphere or kept in a vacuum state, both of which are effective in terms of preventing dew condensation in the cavity.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 4 is a diagram showing the cross sectional structure of the photodetection device according to the present invention taken along line III-III in FIG. 2;

BEST MODES FOR CARRYING OUT THE INVENTION

Embodiments of a photodetection device and a manufacturing method therefore according to the present invention shall now be described in detail using FIGS. 2 to 4 and 5A to 6C. In the description of the drawings, the same symbols shall be attached to portions and elements that are the same and redundant description shall be omitted.

Figure 1:
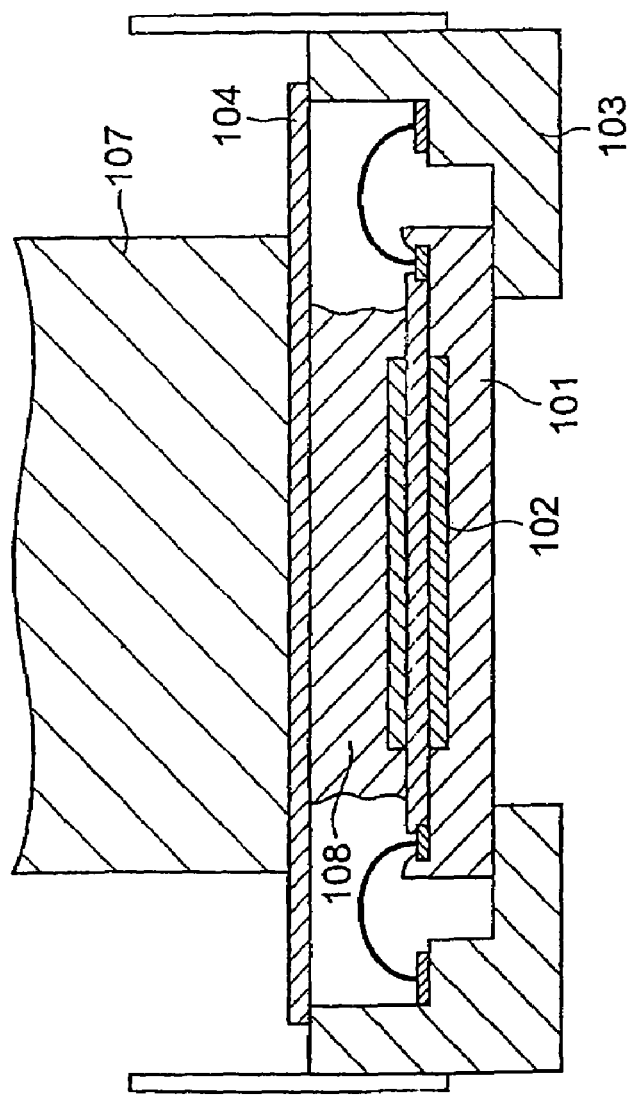
FIG. 1 is a diagram showing the cross-sectional structure of a conventional back-illuminated type photodetection device.
Figure 2:
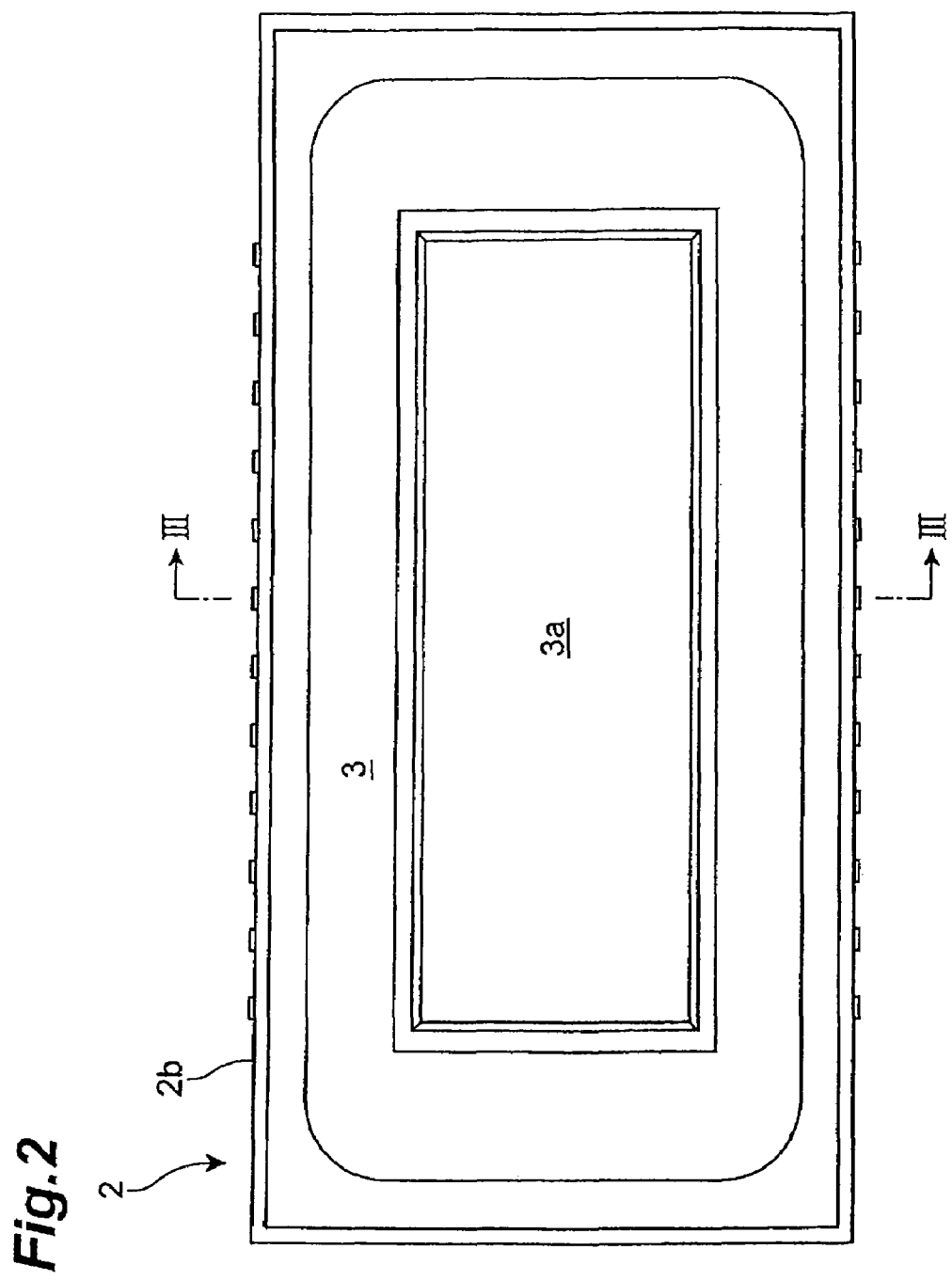
FIG. 2 is a plan view of a photodetection device according to the present invention as viewed from an upper part side (back surface side of a semiconductor substrate onto which light is made incident)
Figure 3:
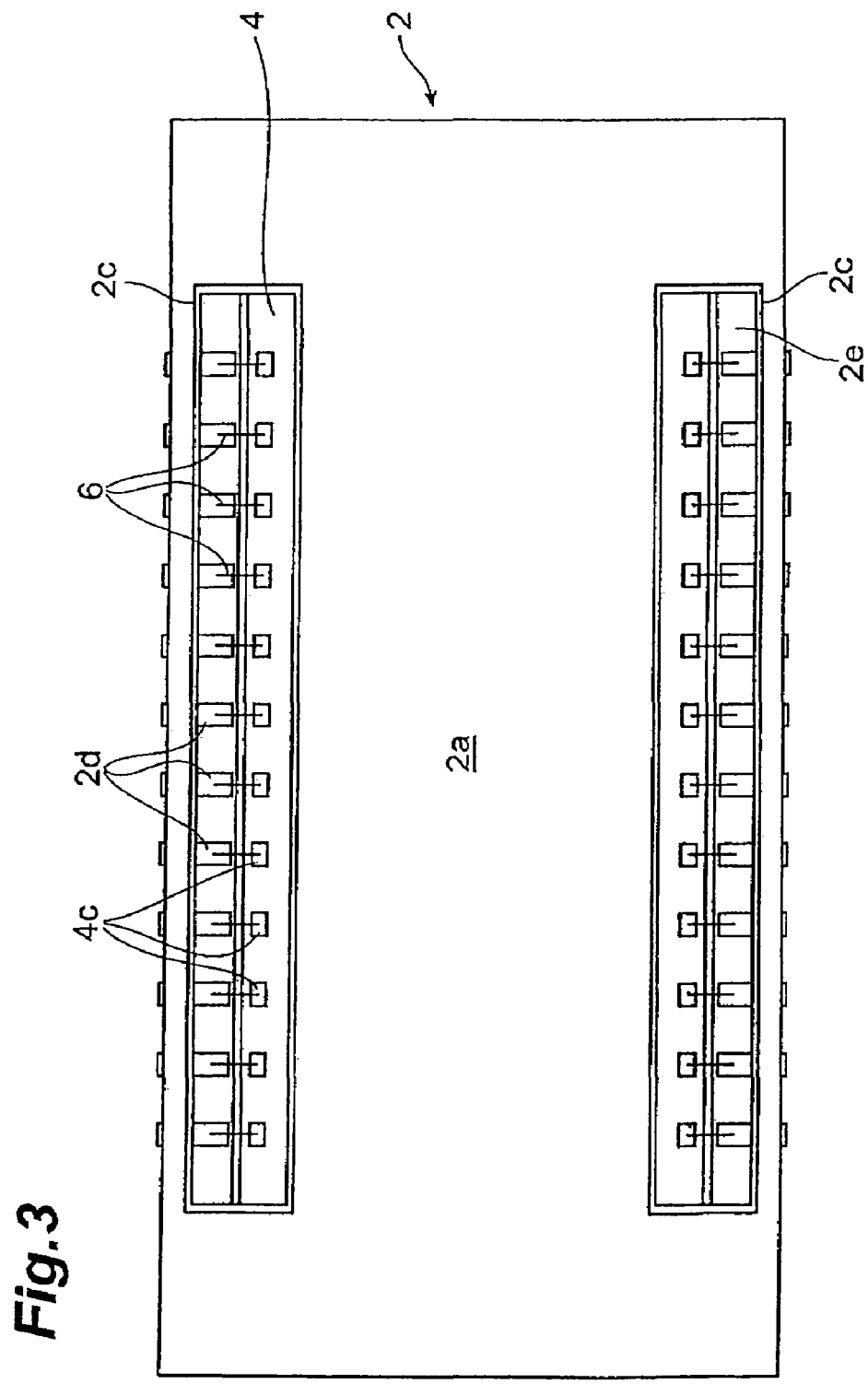
FIG. 3 is a plan view of the photodetection device of FIG. 2 as viewed from a bottom part side (front surface side of the semiconductor substrate)

FIG. 2 is a plan view of a photodetection device according to the present invention as viewed from an upper part side (back surface side of a semiconductor substrate onto which light is made incident), FIG. 3 is a plan view of the photodetection device of FIG. 2 as viewed from a bottom part side (front surface side of the semiconductor substrate), and FIG. 4 is a diagram showing the cross sectional structure of the photodetection device according to the present invention taken along line III-III in FIG. 2.

The photodetection device according to the present invention is equipped with a package 2, having a cavity 2f surrounded by a bottom part 2a (cavity bottom part) and side walls 2b (cavity inner walls), and a top plate 3, covering the upper opening of this cavity 2f. In outer appearance, this photodetection device has a substantially rectangular parallelepiped shape, and in cavity 2f of package 2 are housed a semiconductor substrate 4 and a cooling device C. Semiconductor substrate 4 has a back surface, which serves as a light-incident surface, and a front surface, which opposes the back surface and on which is disposed a CCD reading part 4a that detects the light propagating from the back surface. Also, cooling device C has a cooling surface 7a, which is for cooling CCD reading part 4a and which, in a state of covering the entirety of CCD reading part 4a, is put in contact with the front surface of semiconductor substrate 4.

Top plate 3 has a light transmitting window 3a disposed near a central part thereof (FIG. 2). Light that is transmitted through this window 3a is made incident on the back surface of semiconductor substrate 4 housed in package 2, is transmitted through semiconductor substrate 4, and reaches CCD reading part 4a, disposed at the front surface (photodetection by the CCD reading part).

At upper end parts of side walls 2b of package 2 is provided a collar part 2e, which extends in the inward direction of cavity 2f, and on this collar part 2e, package terminals 2d are aligned in two columns along the long sides of bottom part 2a of rectangular shape and so as to face bottom part 2a.

Package 2 also has two working openings 2c provided in and along the long sides of bottom part 2a. These working openings 2c are openings for inserting the head of a bonding machine in the process of connecting electrode pads 4c of semiconductor substrate with package terminals 2d, provided on side walls 2b, and are disposed at positions such that electrode pads 4c and package terminals 2d will be exposed.

The front surface of semiconductor substrate 4 comprises a region 4b, at which CCD reading part 4a is disposed, and a peripheral region, in which electrode pads 4c, for sending signals from CCD reading part 4a to the exterior, are aligned in two columns along working openings 2c. Electrode pads 4c are in a one-to-one correspondence with package terminals 2d and the corresponding components are electrically connected to each other by bonding wires 6.

Meanwhile, in the back surface of semiconductor substrate 4, a recess is provided at a region corresponding to region 4b, at which CCD reading part 4a is disposed, and the thickness of region 4b is thereby made thinner than the thickness of the remaining peripheral regions. Semiconductor substrate 4 is mounted to cavity bottom part 2a via cooling device C so that the front surface, on which CCD reading part 4a is formed, faces cavity bottom part 2a.

Semiconductor substrate 4 is positioned inside package 2 in a state in which it is separated from the inner walls (side walls 2b) of cavity 2f by a predetermined distance.

Cooling device C is arranged from a Peltier element 5 and a cooling plate 7, and a heat generating side 5b of Peltier element 5 is fixed via an adhesive, etc. to bottom part 2a of package 2. A cooling plate 7, which is a plate-like member, is put in contact with a cooling side 5a of the Peltier element. Cooling plate 7 is interposed between semiconductor substrate 4 and cooling side 5a and the surface thereof that is put in contact with semiconductor substrate 4 is a cooling surface 7a.

This cooling surface 7a has a size that is larger than region 4b, at which CCD reading part 4a is disposed, and yet smaller than the entirety of the front surface of semiconductor substrate 4. Cooling surface 7a thus covers region 4b, at which CCD reading part 4a is disposed, in a state of exposing the regions in which electrode pads 4c are positioned. In other words, electrode pads 4c are positioned at regions of the front surface of semiconductor substrate 4 that are peripheral to the region covered by cooling surface 7a.

Here, package 2 is preferably formed of ceramic or other material having an electrical insulating property and being excellent in mechanical strength. Window 3a is preferably formed of quartz glass or other material having an adequate light transmitting property. Also, since this photodetection device is used with the interior of package 2 put in a state of being filled with an inert gas atmosphere or in a vacuum state, top plate 3 and package 2 are preferably joined by welding, etc. so that leaks will not occur from the joined parts.

In order to put the interior of package 2 in a state of being filled with an inert gas atmosphere or in a vacuum state as mentioned above, working openings 2c are closed by covers, etc. after completion of the work (wire bonding work) of connecting bonding wires 6 across electrode pads 4c and package terminals 2d.

The material of cooling plate 7 is not restricted in particular as long as it is comparatively hard and has an adequate heat conducting property, and glass, silicon substrate, ceramic, etc., may be used.

Also, the thickness of cooling plate 7 is preferably that within a range in which the thin part (region 4b at which CCD reading part 4a is formed) of semiconductor substrate 4 can be reinforced mechanically and CCD reading part 4a can be cooled adequately. In order to mechanically reinforce the thin part (region 4b at which CCD reading part 4a is formed) of semiconductor substrate 4, cooling plate 7 has a size that is larger than region 4b and yet smaller than the entirety of the front surface of semiconductor substrate 4. Cooling plate 7 has a shape with which electrode pads 4c on the front surface of semiconductor substrate 4 will be exposed (shape with which electrode pads 4c will not be covered).

In regard to the gap d between semiconductor substrate 4 and side walls 2b, the wider the gap, the better in terms of restraining the conduction of heat from side walls 2b. On the other hand, from the standpoint of making bonding wires 6 short, the narrower the gap, the better. The gap must thus be determined in consideration of the balance between these factors. The gap d is, for example, preferably approximately 2.0±0.2 mm.

As described above, with the photodetection device according to the present invention, cooling plate 7, which is connected to cooling side 5a of Peltier element 5, directly contacts CCD reading part 4a. CCD reading part 4a can thus be cooled efficiently. Also, since with the exception of cooling plate 7 and bonding wires 6, semiconductor substrate 4 is not in contact with package 2, conduction of heat from package 2 to semiconductor substrate 4 is restrained efficiently.

Also, since cooling plate 7 has a size that is larger than the thin part (region 4b at which CCD reading part 4a is formed) of semiconductor substrate 4, it can mechanically reinforce semiconductor substrate 4.

Furthermore since electrical pads 4c can be connected to package terminals 2d by bonding wires 6 through working openings 2c, the wiring for taking out charge signals of CCD reading part 4a to the exterior can be made short in length and the high-speed response property of the photodetection device can be maintained satisfactorily.

Figure 5A:
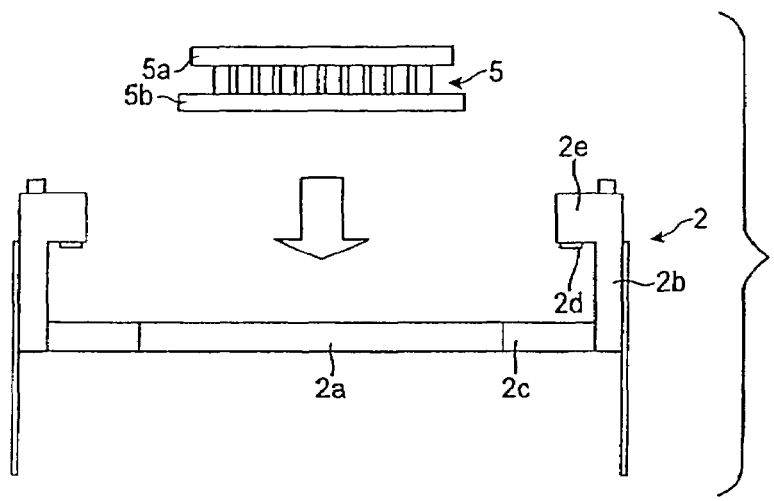
FIGS. 5A to 5C are process diagrams for explaining the photodetection device manufacturing method according to the present invention (part 1)
Figure 5B:
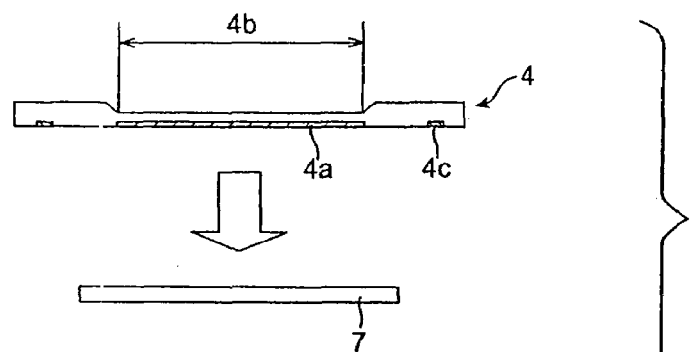
Figure 5C:
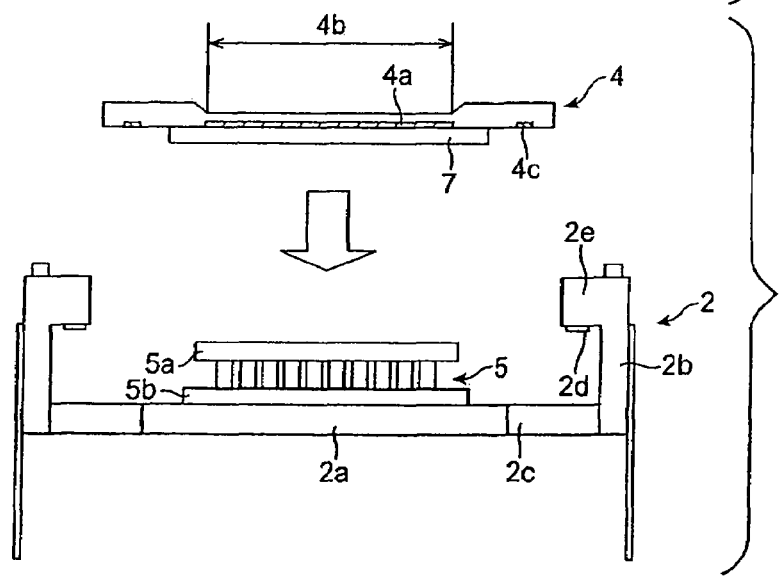
Figure 6A:
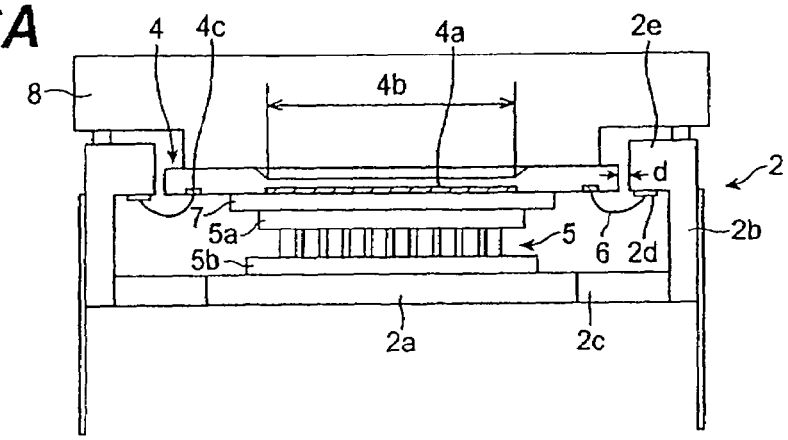
FIGS. 6A to 6C are process diagrams for explaining the photodetection device manufacturing method according to the present invention (part 2).
Figure 6B:
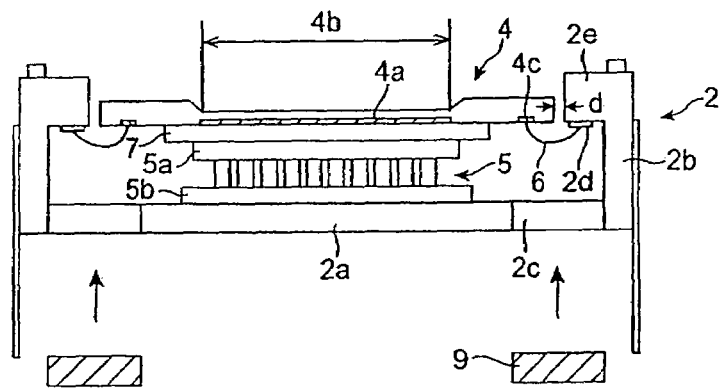
Figure 6C:
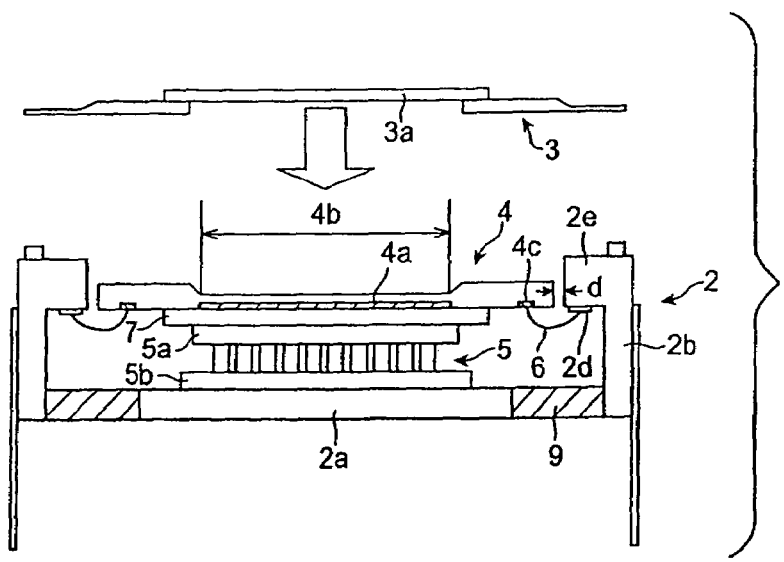

The photodetection device manufacturing method according to the present invention shall now be described using FIGS. 5A to 5C and FIGS. 6A to 6C. FIGS. 5A to 5C illustrate first to third steps of this manufacturing method and FIGS. 6A to 6C illustrate fourth to sixth steps of this manufacturing method.

First, in the first step, Peltier element 5 is adhered by an epoxy resin or other adhesive onto a predetermined position of bottom part 2a (cavity bottom part) of package 2. In this process, adhesion is performed so that bottom part 2a and heat generating side 5b of the Peltier element contact each other (FIG. 5A).

Then in the second step, semiconductor substrate 4, wherein region 4b, at which CCD reading part 4a is formed, is equipped at the front surface, the portion corresponding to region 4b is thinned, and electrode pads 4c are positioned in peripheral regions of region 4b of the front surface, is prepared, and cooling plate 7 is adhered via an epoxy resin or other adhesive onto the front surface of this semiconductor substrate 4.

In this process, cooling plate 7 is adhered onto the front surface of semiconductor substrate 4 in the state of covering region 4b, at which CCD reading part 4a is formed, and exposing electrode pads 4c (FIG. 5B).

The above-described first and second steps may be switched in order or may be carried out in parallel.

Furthermore in the third step, the work of connecting semiconductor substrate 4 with cooling plate 7 adhered thereon, which was obtained in the second step, to package 2 with Peltier element 5 adhered thereon, which was obtained in the first step, is carried out.

That is, semiconductor substrate 4 with cooling plate 7 adhered thereon is inserted into the interior of package 2 so that cooling plate 7 and cooling side 5a of Peltier element 5 face each other. Then with a predetermined gap d being secured between semiconductor substrate 4 and side walls 2b of package 2, the one surface of cooling plate 7, at which semiconductor substrate 4 is not adhered, and cooling side 5a of Peltier element 5 are adhered together via an epoxy resin or other adhesive (FIG. 5C).

In the fourth step, electrode pads 4c and package terminals 2d, formed on collar part 2e, are electrically connected by bonding wires 6 (wire bonding work). That is, a wire bonding holding jig 8 is inserted into the interior of package 2 from the upper opening of cavity 2f, and the back surface (surface on which CCD reading part 4a is not formed) of semiconductor substrate 4 is supported by wire bonding holding jig 8. In this state, wire bonding work, using a bonding machine, etc., is performed via working openings 2c provided in bottom part 2a (FIG. 6A).

By thus supporting semiconductor substrate 4 by wire bonding holding jig 8, breakage of semiconductor substrate 4 is avoided, and the wire bonding work can be carried out safely.

Then in the fifth step, the work of closing working openings 2c is performed. That is, covers 9, formed of ceramic, etc., are adhered onto working openings 2c to close working openings 2c (FIG. 6B).

Lastly in the sixth step, top plate 3 is mounted to the upper opening of package 2 by welding, etc. in an inert gas atmosphere or in vacuum (FIG. 6C). Since the interior of the above-described photodetection device is filled with an inert gas atmosphere or is put in a vacuum state by this work, dew condensation inside cavity 2f is prevented effectively.

Through the above-described manufacturing steps, the photodetection device according to the present invention is obtained.

With the above-described photodetection device manufacturing method, since CCD reading part 4a is directly cooled by cooling side 5a of Peltier element 5 via cooling plate 7, CCD reading part 4a can be cooled efficiently.

Also, since the wire bonding work (the work of electrically connecting electrode pads 4c and package terminals 2d via bonding wires) is carried out via working openings 2c, the wiring for taking out charge signals of CCD reading part 4a to the exterior can be made short in length. In this step, since the back surface of semiconductor substrate 4 is supported by wire bonding holding jig 8, semiconductor substrate 4 will not break during the wire bonding work.

Also, since the upper opening of package 2 is closed by top plate 3 in an inert gas atmosphere or in vacuum, dew condensation inside the above-described photodetection device is prevented effectively.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

In accordance with the present invention, a photodetection device and a manufacturing method therefore, which enable the CCD reading part to be cooled efficiently and enable the entire device to be made compact, can be provided.

The invention claimed is:

1. A photodetection device comprising:
a semiconductor substrate having a back surface which serves as a light-incident surface, and a front surface which opposes said back surface and is provided with a charge reading part constituted by a charge-coupled device that detects light propagating from said back surface, said semiconductor substrate having a structure such that the thickness of a region at which said charge reading part is disposed is thinner than the thickness of the remaining region;
a cooling device cooling said charge reading part, said cooling device having a cooling surface which has a size that is larger than the region at which said charge reading part is disposed and yet smaller than the entirety of said front surface of said semiconductor substrate, and which contacts the front surface of said semiconductor substrate while covering the entirety of said charge reading part;
a package having a cavity which houses both said semiconductor substrate and said cooling device, and being provided with package terminals electrically communicating between said cavity and the exterior thereof;
electrode pads provided on said front surface of said semiconductor substrate and positioned at the peripheral of the region covered by said cooling surface; and
bonding wires electrically connecting said package terminals and said electrode pads,
wherein said cooling device is fixed to said package while the surface at the opposite side of said cooling surface contacts a bottom part of said cavity of said package, and
wherein a working opening is provided at the cavity bottom part of said package that correspond to said electrode pads and said package terminals.

2. A photodetection device according to claim 1, further comprising a cover for closing said working opening provided at the cavity bottom part of said package.

3. A photodetection device according to claim 1, wherein said package has a top plate for closing an upper opening of said cavity.

4. A photodetection device according to claim 1, wherein said semiconductor substrate, housed in said cavity, is supported on said package via said cooling device while being separated by a predetermined distance from the inner wall of said cavity.

5. A photodetection device according to claim 1, wherein said cooling device includes a Peltier element, and a cooling plate contacting the cooling side of said Peltier element, and
wherein a back surface of said cooling plate, which is opposite the surface that contacts the cooling side of said Peltier element, contacts the front surface of said semiconductor substrate as the cooling surface.

6. A photodetection device manufacturing method comprising the steps of:
preparing a semiconductor substrate having a back surface which serves as a light-incident surface, and a front surface which opposes said back surface and is provided with a charge reading part constituted by a charge-coupled device that detects light propagating from said back surface, said semiconductor substrate having a structure such that the thickness of a region at which said charge reading part is disposed is thinner than the thickness of the remaining region;
preparing a cooling device having a cooling surface with a size smaller than the entirety of said front surface of said semiconductor substrate and yet larger than the region at which said charge reading part is disposed;
preparing a package having a cavity which houses both said semiconductor substrate and said cooling device;
disposing said cooling device inside said cavity of said package such that a back surface of said cooling device, at the side opposite said cooling surface, faces a cavity bottom part of said package;
disposing said semiconductor substrate in said cavity of said package such that said cooling surface contacts said charge reading part in a covering manner and yet said semiconductor substrate is separated from the inner wall of said cavity of said package by a predetermined distance; and
connecting electrode pads, which are disposed on said front surface of said semiconductor substrate and positioned at the peripheral to the region covered by said cooling surface, to package terminals provided on said package, by bonding wires,
wherein, at a bottom part of said cavity of said package, a working opening is provided at a position corresponding to said electrode pads and said package terminals, and
wherein the connections made by said bonding wires are made through said working opening.

7. A photodetection device manufacturing method according to claim 6, wherein the connections made by said bonding wires are made in a state in which said semiconductor substrate is supported by a jig that has been inserted from an upper opening of said cavity of said package.

8. A photodetection device manufacturing method according to claim 6, wherein, after making the connections by said bonding wires, said working opening is closed by a cover.

9. A photodetection device manufacturing method according to claim 6, wherein, after making the connections by said bonding wires, an upper opening of said cavity of said package is closed by a top plate.

* * * * *